(12) United States Patent
Namiki et al.

(10) Patent No.: US 10,597,609 B2
(45) Date of Patent: *Mar. 24, 2020

(54) CLEANING LIQUID, ANTICORROSION AGENT, AND METHOD FOR MANUFACTURING THE SAME

(71) Applicant: TOKYO OHKA KOGYO CO., LTD., Kawasaki-shi (JP)

(72) Inventors: Takumi Namiki, Kawasaki (JP); Takayuki Haraguchi, Hsinchu (TW); Yu-Geng Wu, Hsinchu (TW)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 118 days.

This patent is subject to a terminal disclaimer.

(21) Appl. No.: 15/855,173

(22) Filed: Dec. 27, 2017

(65) Prior Publication Data

US 2018/0187128 A1    Jul. 5, 2018

(30) Foreign Application Priority Data

Dec. 29, 2016 (JP) ................. 2016-257441
Dec. 14, 2017 (JP) ................. 2017-239822

(51) Int. Cl.
| | | |
|---|---|---|
| *C11D 7/50* | (2006.01) | |
| *C11D 3/00* | (2006.01) | |
| *C11D 3/30* | (2006.01) | |
| *C11D 11/00* | (2006.01) | |
| *B08B 3/08* | (2006.01) | |
| *C23F 11/06* | (2006.01) | |
| *C23F 11/04* | (2006.01) | |
| *H01L 21/311* | (2006.01) | |
| *C11D 7/32* | (2006.01) | |
| *C23F 11/14* | (2006.01) | |
| *H01L 21/02* | (2006.01) | |
| *H01L 21/321* | (2006.01) | |

(52) U.S. Cl.
CPC .............. *C11D 3/0073* (2013.01); *B08B 3/08* (2013.01); *C11D 3/30* (2013.01); *C11D 7/3209* (2013.01); *C11D 7/3218* (2013.01); *C11D 7/50* (2013.01); *C11D 11/0047* (2013.01); *C23F 11/04* (2013.01); *C23F 11/06* (2013.01); *C23F 11/142* (2013.01); *H01L 21/02068* (2013.01); *H01L 21/31133* (2013.01); *H01L 21/321* (2013.01)

(58) Field of Classification Search
CPC .................................................. C11D 11/0047
USPC .......................................................... 510/175
See application file for complete search history.

(56) References Cited

U.S. PATENT DOCUMENTS

| | | | |
|---|---|---|---|
| 9,034,810 B2 | 5/2015 | Mizuta et al. | |
| 2009/0082240 A1* | 3/2009 | Nukui | G03F 7/423 510/176 |
| 2012/0157368 A1 | 6/2012 | Mizuta et al. | |
| 2016/0122695 A1* | 5/2016 | Kumagai | C11D 7/3281 510/176 |
| 2016/0179011 A1* | 6/2016 | Agarwal | C11D 7/261 510/176 |
| 2018/0187133 A1* | 7/2018 | Namiki | C11D 7/06 |

FOREIGN PATENT DOCUMENTS

WO    WO 2011/027772 A1    3/2011

* cited by examiner

*Primary Examiner* — Gregory E Webb
(74) *Attorney, Agent, or Firm* — Knobbe, Martens, Olson & Bear LLP

(57) ABSTRACT

A cleaning liquid and an anticorrosion agent having an excellent corrosion inhibition function, and a method for manufacturing the same. The cleaning liquid contains alkanol hydroxyamine represented by general formula (1), alkanolamine represented by general formula (2), a solvent, and a basic compound other than the alkanol hydroxyamine and the alkanolamine or an acidic compound. In the general formula (1), $R^{a1}$ and $R^{a2}$ each independently represents a C1-C10 alkyl group having one to three hydroxy groups, or a hydrogen atom, $R^{a1}$ and $R^{a2}$ are not simultaneously a hydrogen atom, and $R^{b1}$ and $R^{b2}$ are not simultaneously a hydrogen atom.

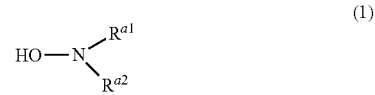

(1)

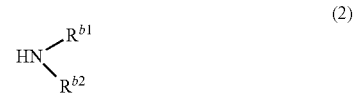

(2)

13 Claims, No Drawings

CLEANING LIQUID, ANTICORROSION AGENT, AND METHOD FOR MANUFACTURING THE SAME

RELATED APPLICATIONS

This application claims priority to Japanese Patent Application No. 2016-257441, filed Dec. 29, 2016, and 2017-239822, filed Dec. 14, 2017, the entire contents of which are incorporated herein by reference.

BACKGROUND OF THE INVENTION

Field of the Invention

The present invention relates to a cleaning liquid and an anticorrosion agent, and a method for manufacturing the same.

Related Art

A semiconductor device is formed by laminating a metal wiring layer, a low dielectric layer, an insulating layer, and the like, on a substrate. Such a semiconductor device is manufactured by processing the above-mentioned layers by a lithography method of carrying out etching process using a resist pattern as a mask.

A resist film and a temporary laminated film (which is also referred to as a sacrificed film) used in the above-mentioned lithography method, as well as residues derived from the metal wiring layer and the low dielectric layer generated in the etching step are removed by using a cleaning liquid so as not to hinder the subsequent step and not to affect the semiconductor device.

Conventionally, as a cleaning liquid to be used in such a manufacturing process of a semiconductor device, a cleaning liquid containing hydroxylamine derivative has been proposed (see, for example, Patent Document 1). Such a cleaning liquid containing hydroxylamine derivative has been improved in terms of removing performance with respect to various residues as compared with the previous cleaning liquids.

Patent Document 1: PCT International Publication No. WO2011/027772

SUMMARY OF THE INVENTION

In recent years, with the tendency toward higher density and higher integration of a semiconductor device, for example, a wiring formation method using a damascene process has been employed. In such a wiring formation method, as metal wiring materials constituting a metal wiring layer of the semiconductor device, easily corrodible metal, for example, cobalt, copper, and tungsten, with each being in a form of a simple substance or an alloy or silicide such as SiGe, is employed as a metal wiring material for a semiconductor device. Cobalt, copper, tungsten, silicide such as SiGe or other easily corrodible metal to be used as the metal wiring material has a problem of being easily corroded by a cleaning liquid. Therefore, a cleaning liquid, which is less likely to cause corrosion on cobalt, copper, tungsten, silicide such as SiGe or other easily corrodible metal in cleaning of a substrate, has been demanded.

The present invention has been made in view of such conventional circumstances, and an object of the present invention is to provide a cleaning liquid and an anticorrosion agent, having an excellent corrosion inhibition function with respect to at least cobalt, copper, tungsten, silicide such as SiGe or other easily corrodible metal and a method for manufacturing the cleaning liquid and the anticorrosion agent.

The present inventors have intensively studied in order to solve the above-mentioned problem. As a result, they have found that use of a mixture of specific alkanol hydroxyamine and alkanolamine for a cleaning liquid can solve the above-mentioned problem, and have completed the present invention. Specifically, the present invention provides the following.

A first aspect of the present invention is a cleaning liquid containing alkanol hydroxyamine represented by the following general formula (1), alkanolamine represented by the following general formula (2), a solvent, as well as any one of a basic compound other than the alkanol hydroxyamine and the alkanolamine and an acidic compound.

(In the formula, $R^{a1}$ and $R^{a2}$ each independently represent a C1-C10 alkyl group having one to three hydroxy groups, or a hydrogen atom. However, $R^{a1}$ and $R^{a2}$ are not simultaneously a hydrogen atom.)

(In the formula, $R^{b1}$ and $R^{b2}$ each independently represent a C1-C10 alkyl group having one to three hydroxy groups, or a hydrogen atom. However, $R^{b1}$ and $R^{b2}$ are not simultaneously a hydrogen atom.)

A second aspect of the present invention is an anticorrosion agent containing alkanol hydroxyamine represented by the above-mentioned general formula (1) and alkanolamine represented by the above-mentioned general formula (2).

A third aspect of the present invention is a method for manufacturing a cleaning liquid or an anticorrosion agent containing alkanol hydroxyamine represented by the above-mentioned general formula (1). The method includes synthesizing the alkanol hydroxyamine by oxidizing alkanolamine represented by the above-mentioned general formula (2).

The present invention can provide a cleaning liquid and an anticorrosion agent, having an excellent corrosion inhibition function with respect to at least cobalt, copper, tungsten, silicide such as SiGe or other easily corrodible metal and a method for manufacturing the cleaning liquid and the anticorrosion agent.

DETAILED DESCRIPTION OF THE INVENTION

«Cleaning Liquid»

A cleaning liquid of the present invention is a composition containing alkanol hydroxyamine represented by the above-mentioned general formula (1) (which may be abbreviated in this specification as simply "alkanol hydroxyamine"), alkanolamine represented by the above-mentioned general formula (2) (which may be abbreviated in this specification as simply "alkanolamine"), a solvent, as well as either any one of a basic compound other than the alkanol hydroxyamine and the alkanolamine (which may be abbreviated in this specification as simply "basic compound") or an acidic compound, and the composition (typically, a liquid composition) is suitable as a cleaning liquid or an anticorrosion agent.

Furthermore, in the cleaning liquid of this embodiment, it is preferable that $R^{a1}$ in the above-mentioned general formula (1) and $R^{b1}$ in the above-mentioned general formula (2) are the same group, and $R^{a2}$ in the above-mentioned general formula (1) and $R^{b2}$ in the above-mentioned general formula (2) are the same group. Furthermore, in the cleaning liquid of this embodiment, it is preferable that Ra1 and Ra2 in the above-mentioned general formula (1) are the same group, and $R^{b1}$ and $R^{b2}$ in the above-mentioned general formula (2) are the same group. It is more preferable that $R^{a1}$, $R^{a2}$, $R^{b1}$ and $R^{b2}$ are the same group.

Such a cleaning liquid is suitable as a cleaning liquid for electronic components such as a semiconductor device and a liquid crystal display (LCD). The cleaning liquid is suitable as a cleaning liquid used in, for example, a lithography process, an etching process, an FEOL (Front End of Line) process such as a chemical mechanical polishing (CMP), a BEOL (Back End of Line) process such as a wiring formation process, and post processes such as through-silicon via (TSV) and a C4 process (Controlled Collapse Chip Connection), and the like, in manufacturing process of a semiconductor, and used for cleaning a substrate having metal on a surface thereof. The substrate having metal on a surface thereof is a substrate on which metal is exposed on at least a part of the substrate surface. Metal is, for example, metal formed as a metal wiring layer, a plug, and other metal constructs on the substrate provided with a semiconductor device. Examples of the substrate include a substrate provided with a semiconductor device by laminating a metal wiring layer, a low dielectric layer, an insulating layer, and the like, on a substrate such as a silicon wafer. Moreover, the substrate may be a substrate having a silicide layer containing, for instance, germanium. The cleaning liquid of this embodiment is suitable for cleaning in lithography or cleaning for lithography, and can be used as a cleaning liquid for lithography.

Examples of the above-mentioned metal include cobalt which is an easily corrodible metal, an alloy thereof, or the like. Examples of the alloy of cobalt include an alloy with at least one element of other transition elements and typical elements (for example, phosphorus, boron, silicon, and the like). Specific examples of the alloy include an alloy containing phosphorus and/or boron, such as CoWPB, and a silicide such as CoSi. Further, the above-mentioned metal may be another easily corrodible metal such as copper, tungsten, germanium or an alloy thereof. Examples of the alloy include an alloy of at least one of copper, tungsten with at least one from other transition elements and typical elements (for example, phosphorus, boron, silicon, and the like). Specific examples of the alloy include an alloy containing phosphorus and/or boron, such as CuPB, and a silicide such as WSi or SiGe. When the below-mentioned dialkanol hydroxyamine and dialkanolamine are used, a corrosion inhibition effect can be easily obtained on not only cobalt but also copper, tungsten and SiGe. Hereinafter, in this specification, "cobalt or an alloy thereof," "copper or an alloy thereof" and "tungsten or an alloy thereof" may be abbreviated simply as "cobalt," "copper" and "tungsten," respectively.

The cleaning liquid of this embodiment contains alkanol hydroxyamine and alkanolamine, and thereby has an excellent corrosion inhibition function with respect to at least cobalt, copper, tungsten, silicide such as SiGe or other easily corrodible metal. Therefore, in cleaning the substrate, even when such a cleaning liquid is brought into contact with cobalt, copper, tungsten, silicide such as SiGe or other easily corrodible metal on the surface of the substrate, corrosion of the cobalt, copper, tungsten, silicide such as SiGe or other easily corrodible metal can be satisfactorily inhibited. Although the mechanism of action is not clarified, it is assumed that the reduction action of alkanol hydroxyamine and alkanolamine inhibits the corrosion of cobalt, copper, tungsten, silicide such as SiGe or other easily corrodible metal. Also, it has been clarified that a mixture of alkanol hydroxyamine and alkanolamine has a higher anti-corrosion effect as compared with the case where alkanolamine is used alone.

Furthermore, alkanol hydroxyamine is useful as a cleaning liquid because it has a lower vapor pressure as compared with alkanolamine, so that even when a temperature of a cleaning liquid is raised to a predetermined temperature to clean, composition change is inhibited. For example, it is suitable to use alkanol hydroxyamine having a vapor pressure of preferably 0.3 mmHg or less, more preferably 0.1 mmHg or less, and further preferably 0.05 mmHg or less. When alkanol hydroxyamine having such a property and alkanolamine are used in combination, it is possible to obtain a cleaning liquid that has a higher anti-corrosion effect and is more useful as compared with the case where alkanolamine is used alone.

Furthermore, alkanol hydroxyamine is useful for a cleaning liquid because it has higher water-solubility as compared with alkanolamine, so that low-cost water can be used as a solvent and in cleaning with such an aqueous solution, residues can be suppressed. For example, it is suitable to use alkanol hydroxyamine having Log P of preferably 0.5 or less. When alkanol hydroxyamine having such a property and alkanolamine are used in combination, it is possible to obtain a cleaning liquid that has a higher anti-corrosion effect and is more useful as compared with the case where alkanolamine is used alone.

The Log P value means an octanol/water distribution coefficient, and can be calculated using parameters by Ghose, Pritchett, Crippen et al. (see, J. Comp. Chem., 9, 80 (1998)). This calculation can be performed using software such as CAChe 6.1 (manufactured by FUJITSU LIMITED).

Hereinafter, each component of a cleaning liquid in accordance with this embodiment is described in detail.

<Alkanol Hydroxyamine>

As alkanol hydroxyamine, alkanol hydroxyamine represented by the above-mentioned general formula (1) is used. In the formula, $R^{a1}$ and $R^{a2}$ each independently represent a C1-C10 alkyl group having one to three hydroxy groups, or a hydrogen atom. However, $R^{a1}$ and $R^{a2}$ are not simultaneously a hydrogen atom.

A preferable alkanol hydroxyamine is dialkanol hydroxyamine in which $R^{a1}$ and $R^{a2}$ are a C1-C10 alkyl group having one to three hydroxy groups. Use of such alkanol hydroxyamine is preferable because a corrosion inhibition effect on not only cobalt but also copper and tungsten, silicide such as SiGe or other easily corrodible metal is obtained.

The number of the hydroxy groups in each of $R^{a1}$ and $R^{a2}$ may be one or two. With one hydroxy group, the effect of the present invention can be exhibited sufficiently. When the number of carbon atoms of each alkyl group in $R^{a1}$ and $R^{a2}$ is 3, the hydroxy group in $R^{a1}$ and $R^{a2}$ may be a primary alcohol or a secondary alcohol; and when the number of carbon atoms of each alkyl group in $R^{a1}$ and $R^{a2}$ is 4 to 10, the hydroxy group may be any of a primary alcohol, a secondary alcohol, or a tertiary alcohol, but preferably a secondary alcohol.

The C1-C10 alkyl group in $R^{a1}$ and $R^{a2}$ may be any of a linear, branched or cyclic alkyl group, and examples thereof include a methyl group, an ethyl group, an n-propyl group, an isopropyl group, an n-butyl group, an isobutyl group, a sec-butyl group, a tert-butyl group, a cyclobutyl group, an n-pentyl group, an isopentyl group, a sec-pentyl group, a tert-pentyl group, a neopentyl group, a 2-methylbutyl group, a 1,2-dimethylpropyl group, a 1-ethylpropyl group, a cyclopentyl group, an n-hexyl group, an isohexyl group, a sec-hexyl group, a tert-hexyl group, a neohexyl group, a 2-methylpentyl group, a 1,2-dimethylbutyl group, a 2,3-dimethylbutyl group, a 1-ethylbutyl group, a cyclohexyl group, an n-heptyl group, an n-octyl group, an n-nonyl group, an n-decyl group, and the like. Among them, a linear or branched C1-C4 alkyl group is preferable, and an ethyl group, an n-propyl group and an isopropyl group are particularly preferable.

Specific examples of the linear or branched C1-C4 alkyl group having one to three hydroxyl groups in $R^{a1}$ and $R^{a2}$ may include a 1-hydroxyethyl group, a 2-hydroxyethyl group, a 1,2-dihydroxyethyl group, a 2,2-dihydroxyethyl group, a 1-hydroxy-n-propyl group, a 2-hydroxy-n-propyl group, a 3-hydroxy-n-propyl group, a 1,2-dihydroxy-n-propyl group, a 1,3-dihydroxy-n-propyl group, a 2,2-dihydroxy-n-propyl group, a 2,3-dihydroxy-n-propyl group, a 3,3-dihydroxy-n-propyl group, a 1,2,3-trihydroxy-n-propyl group, a 2,2,3-trihydroxy-n-propyl group, a 2,3,3-trihydroxy-n-propyl group, a 1-hydroxyisopropyl group, a 2-hydroxyisopropyl group, a 1,1-dihydroxyisopropyl group, a 1,2-dihydroxyisopropyl group, a 1,3-dihydroxyisopropyl group, a 1,2,3-trihydroxyisopropyl group, a 1-hydroxy-n-butyl group, a 2-hydroxy-n-butyl group, a 3-hydroxy-n-butyl group, a 4-hydroxy-n-butyl group, a 1,2-dihydroxy-n-butyl group, a 1,3-dihydroxy-n-butyl group, a 1,4-dihydroxy-n-butyl group, a 2,2-dihydroxy-n-butyl group, a 2,3-dihydroxy-n-butyl group, a 2,4-dihydroxy-n-butyl group, a 3,3-dihydroxy-n-butyl group, a 3,4-dihydroxy-n-butyl group, a 4,4-dihydroxy-n-butyl group, a 1,2,3-trihydroxy-n-butyl group, a 1,2,4-trihydroxy-n-butyl group, a 1,3,4-trihydroxy-n-butyl group, a 2,2,3-trihydroxy-n-butyl group, a 2,2,4-trihydroxy-n-butyl group, a 2,3,3-trihydroxy-n-butyl group, a 3,3,4-trihydroxy-n-butyl group, a 2,4,4-trihydroxy-n-butyl group, a 3,4,4-trihydroxy-n-butyl group, a 2,3,4-trihydroxy-n-butyl group, a 1-hydroxy-sec-butyl group, a 2-hydroxy-sec-butyl group, a 3-hydroxy-sec-butyl group, a 4-hydroxy-sec-butyl group, a 1,1-dihydroxy-sec-butyl group, a 1,2-dihydroxy-sec-butyl group, a 1,3-dihydroxy-sec-butyl group, a 1,4-dihydroxy-sec-butyl group, a 2,3-dihydroxy-sec-butyl group, a 2,4-dihydroxy-sec-butyl group, a 3,3-dihydroxy-sec-butyl group, a 3,4-dihydroxy-sec-butyl group, a 4,4-dihydroxy-sec-butyl group, a 1-hydroxy-2-methyl-n-propyl group, a 2-hydroxy-2-methyl-n-propyl group, a 3-hydroxy-2-methyl-n-propyl group, a 1,2-dihydroxy-2-methyl-n-propyl group, a 1,3-dihydroxy-2-methyl-n-propyl group, a 2,3-dihydroxy-2-methyl-n-propyl group, a 3,3-dihydroxy-2-methyl-n-propyl group, a 3-hydroxy-2-hydroxymethyl-n-propyl group, a 1,2,3-trihydroxy-2-methyl-n-propyl group, a 1,3,3-trihydroxy-2-methyl-n-propyl group, a 2,3,3-trihydroxy-2-methyl-n-propyl group, a 1,3-dihydroxy-2-hydroxymethyl-n-propyl group, a 2,3-dihydroxy-2-hydroxymethyl-n-propyl group, a 1-hydroxy-2-methyl isopropyl group, a 1,3-dihydroxy-2-methyl isopropyl group, a 1,3-dihydroxy-2-hydroxymethyl isopropyl group, and the like. A 2-hydroxyethyl group, a 2-hydroxy-n-propyl group and 2-hydroxyisopropyl group are particularly preferable.

The content of alkanol hydroxyamine relative to the total of alkanol hydroxyamine and alkanolamine is preferably 0.01 to 99.9 mass %, more preferably 1 to 90 mass %, and further preferably 10 to 70 mass %. When such a content is employed, a substance to be cleaned up can be effectively removed while corrosion of easily corrodible metal, in particular cobalt, copper, tungsten or silicide such as SiGe is inhibited.

Furthermore, the content of alkanol hydroxyamine relative to the total of the cleaning liquid is preferably 0.001 to 10 mass %, more preferably 0.01 to 5 mass %, and further preferably 0.01 to 0.5 mass %. When such a content is employed, a substance to be cleaned up can be effectively removed while corrosion of easily corrodible metal, in particular cobalt, copper, tungsten or silicide such as SiGe is inhibited.

<Alkanolamine>

As alkanolamine, an alkanolamine represented by the above-mentioned general formula (2) is used. In the formula (2), $R^{b1}$ and $R^{b2}$ each independently represent a C1-C10 alkyl group having one to three hydroxy groups, or a hydrogen atom. However, $R^{b1}$ and $R^{b2}$ are not simultaneously a hydrogen atom.

A preferable alkanolamine is dialkanol hydroxyamine in which $R^{b1}$ and $R^{b2}$ are a C1-C10 alkyl group having one to three hydroxy groups. Use of such alkanolamine is preferable because a corrosion inhibition effect on not only cobalt but also copper, tungsten copper, tungsten, silicide such as SiGe or other easily corrodible metal is obtained.

Examples of the hydroxy group in $R^{b1}$ and $R^{b2}$ are the same as those described for the hydroxy group of $R^{a1}$ and $R^{a2}$ in the general formula (1), and is preferably a secondary alcohol when the number of carbon atoms of each alkyl group in $R^{b1}$ and $R^{b2}$ is 3, and when the number of carbon atoms of each alkyl group in $R^{b1}$ and $R^{b2}$ is 4 to 10.

Examples of the C1-C10 alkyl group in $R^{b1}$ and $R^{b2}$ include the same as those described in the general formula (1). A linear or branched C1-C4 alkyl group is preferable, and an ethyl group, an n-propyl group and an isopropyl group are particularly preferable.

Specific examples of the linear or branched C1-C4 alkyl group having one to three hydroxyl groups in $R^{b1}$ and $R^{b2}$ include the same as those described in the general formula (1). A 2-hydroxyethyl group and a 2-hydroxy-n-propyl group are particularly preferable.

Furthermore, the content of alkanolamine relative to the total of the cleaning liquid is preferably 0.001 to 10 mass %, more preferably 0.01 to 3 mass %, and further preferably 0.01 to 0.5 mass %. When such a content is employed, a substance to be cleaned up can be effectively removed while corrosion of cobalt, copper, tungsten, silicide such as SiGe or other easily corrodible metal is inhibited.

<Solvent>

It is preferable that a solvent contains water. As water, pure water, deionized water, ion exchanged water, and the like, can be used. As the solvent, in addition to water, a water-soluble organic solvent can be used in order to improve solubility of alkanol hydroxyamine and alkanolamine. As the water-soluble organic solvent, it is possible to use a compound that is commonly used in the field of the art. The water-soluble organic solvent may be used alone or in combination of two or more thereof. For a solvent, it is preferable that water and a water-soluble organic solvent are used in combination. When water and a water-soluble organic solvent are used in combination for a solvent, the content of water relative to the total of the water and the water-soluble organic solvent is preferably 1 to 99 mass %, more preferably 10 to 40 mass %, and further preferably 15 to 30 mass %.

Examples of the water-soluble organic solvent include: sulfoxides such as dimethylsulfoxide; sulfones such as dimethylsulfone, diethylsulfone, bis(2-hydroxyethyl)sulfone, and tetramethylene sulfone; amides such as N,N-dimethylformamide, N-methylformamide, N,N-dimethylacetamide, N-methylacetamide, and N,N-diethylacetamide; lactams such as N-methyl-2-pyrrolidone, N-ethyl-2-pyrrolidone, N-hydroxymethyl-2-pyrrolidone, and N-hydroxyethyl-2-pyrrolidone; lactones such as β-propiolactone, γ-butyrolactone, γ-valerolactone, δ-valerolactone, γ-caprolactone, and ε-caprolactone; imidazolidinones such as 1,3-dimethyl-2-imidazolidinone, 1,3-diethyl-2-imidazolidinone, and 1,3-diisopropyl-2-imidazolidinone; polyhydric alcohols such as ethylene glycol, propylene glycol, 1,2-butylene glycol, 1,3-butylene glycol, 2,3-butylene glycol, glycerine, and diethylene glycol; glycol ether solvents including glycol monoalkyl ethers such as ethylene glycol monomethyl ether, ethylene glycol monoethyl ether, ethylene glycol monopropyl ether, ethylene glycol monobutyl ether, ethylene glycol monoallyl ether, propylene glycol monomethyl ether, propylene glycol monoethyl ether, propylene glycol monopropyl ether, propylene glycol monobutyl ether, 3-methoxy-3-methyl-1-butanol, diethylene glycol monomethyl ether, diethylene glycol monoethyl ether, diethylene glycol monopropyl ether, diethylene glycol monobutyl ether, diethylene glycol monobenzyl ether, dipropylene glycol monomethyl ether, dipropylene glycol monoethyl ether, dipropylene glycol monopropyl ether, dipropylene glycol monobutyl ether, triethylene glycol monomethyl ether, triethylene glycol monoethyl ether, triethylene glycol monopropyl ether, triethylene glycol monobutyl ether, and tripropylene glycol monobutyl ether; and glycol dialkyl ethers such as ethylene glycol dimethyl ether, diethylene glycol dimethyl ether, triethylene glycol dimethyl ether, tetraethylene glycol dimethyl ether, diethylene glycol methyl ethyl ether, and diethylene glycol diethyl ether; and glycol ester solvents such as ethylene glycol monoacetate, ethylene glycol monomethyl ether acetate, ethylene glycol monoethyl ether acetate, and diethylene glycol monoacetate, and the like.

Among them, a preferable solvent as a water-soluble organic solvent is at least one selected from the group consisting of dipropylene glycol monomethyl ether (DPM), propylene glycol (PG), 3-methoxy-3-methyl-1-butanol, dimethylsulfoxide, propylene glycol monomethyl ether, propylene glycol monoethyl ether, propylene glycol monopropyl ether, diethylene glycol monoethyl ether (ethyl diglycol), and diethylene glycol monobutyl ether.

When the water-soluble organic solvent is contained, the content of the water-soluble organic solvent is preferably 1 to 99 mass %, more preferably 10 to 85 mass %, and further preferably 30 to 80 mass % relative to the total amount of the cleaning liquid. When such a content is employed, a substance to be cleaned up can be effectively removed while corrosion of easily corrodible metal, in particular cobalt, copper, tungsten, or silicide such as SiGe is inhibited.

<Basic Compound>

A basic compound is not particularly limited as long as it is a compound other than alkanol hydroxyamine and alkanolamine, and has a cleaning function. For example, it is preferable to use at least one selected from the group consisting of quaternary ammonium hydroxide, a hydroxyamine compound other than alkanol hydroxyamine represented by the above-mentioned general formula (1), alkyl amine, and ammonia. The basic compounds may be used alone or in combination of two or more thereof.

[Quaternary Ammonium Hydroxide]

As the basic compound, for example, quaternary ammonium hydroxide can be used. Preferable examples of the quaternary ammonium hydroxide include a compound represented by the following general formula (3).

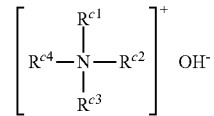

(3)

In the above-mentioned general formula (3), $R^{c1}$ to $R^{c4}$ each independently represent a C1-16 alkyl group, a C1-16 aryl group, a C7-16 aralkyl group, or a C1-16 hydroxy alkyl group.

Among the compounds represented by the above-mentioned general formula (3), at least one selected from the group consisting of tetramethyl ammonium hydroxide (TMAH), tetraethyl ammonium hydroxide, tetrapropyl ammonium hydroxide, tetrabutyl ammonium hydroxide, methyl tripropyl ammonium hydroxide, methyl tributyl ammonium hydroxide, ethyl trimethyl ammonium hydroxide, dimethyl diethyl ammonium hydroxide, benzyl trimethyl ammonium hydroxide, hexadecyl trimethyl ammonium hydroxide, and (2-hydroxyethyl) trimethyl ammonium hydroxide is particularly preferable from the viewpoint of availability. Furthermore, tetramethyl ammonium hydroxide and tetraethyl ammonium hydroxide are preferable from the viewpoint that solubility with respect to a substance to be cleaned up is high and cleaning performance is high.

[Inorganic Base]

Furthermore, as the basic compound, for example, an inorganic base and quaternary ammonium hydroxide may be used in combination. The inorganic base is preferably hydroxides of alkali metal, for example, potassium hydroxide, sodium hydroxide, and rubidium hydroxide, and more preferably potassium hydroxide.

[Hydroxyamine Compound]

Furthermore, as the basic compound, for example, a hydroxyamine compound other than an alkanol hydroxyamine represented by the general formula (1) can be used. Examples of the hydroxyamine compound can include hydroxyamine (HO—NH$_2$), N-methyl hydroxyamine, N,N-diethyl hydroxyamine, N-ethyl hydroxyamine, N,N-dimethyl hydroxyamine, N-(tert-butyl)hydroxyamine, N-propyl hydroxyamine, and the like.

[Alkyl Amine]

Furthermore, as the basic compound, for example, an alkyl amine can be used. Examples of the alkyl amine compound include N-methylamine, N,N-diethylamine, N-ethylamine, N,N-dimethylamine, N-(tert-butyl)amine, N-propylamine, and the like.

[Other Basic Compounds]

Furthermore, as the basic compound, ammonia can be also used.

The content of the basic compound is different depending on the strength of basicity, but it is preferably 0.5 to 30 mass %, and more preferably 1 to 20 mass % relative to the total amount of the cleaning liquid. When such a content is employed, a substance to be cleaned up can be effectively removed while corrosion of easily corrodible metal, in particular cobalt, copper, tungsten, or silicide such as SiGe is inhibited. Note here that when the inorganic base is used in combination with quaternary ammonium hydroxide, the content of the inorganic base is preferably 0.1 mass ppm to 1 mass %, and more preferably 1 mass ppm to 1000 mass ppm relative to the total amount of the cleaning liquid. When such a content is employed, a substance to be cleaned up can be effectively removed while corrosion of easily corrodible metal, in particular cobalt, copper, tungsten, or silicide such as SiGe is inhibited.

<Acidic Compound>

When a cleaning liquid is acidic, an acidic compound to be blended in the cleaning liquid can be appropriately selected from proton acids within a range where the objects of the present invention are not impaired. Specific examples of suitable acidic compounds include proton acids such as hydrochloric acid, hydrofluoric acid, sulfuric acid, nitric acid, formic acid, acetic acid, propionic acid, butyric acid, isobutyric acid, valeric acid, isovaleric acid, lactic acid, oxalic acid, malonic acid, succinic acid, glutaric acid, adipic acid, citric acid, glycolic acid, diglycolic acid, phosphoric acid, methanesulfonic acid, trifluoroacetic acid, and trifluoromethane sulfonic acid. The acidic compounds may be used in combination of two or more thereof.

The blending amount of the acidic compound to the cleaning liquid is different depending on the strength of the acidity of the compound, but is typically preferably 0.1 to 20 mass %, and more preferably 0.5 to 15 mass % relative to the total amount of the cleaning liquid. The blending amount is further preferably 1.0 to 10 mass %. When such a content is employed, a substance to be cleaned up can be effectively removed while corrosion of easily corrodible metal, in particular cobalt, copper, tungsten, silicide such as SiGe is inhibited.

<Other Components>

The other components such as a surfactant may be added to the cleaning liquid of this embodiment, to the extent not hindering the effect of the present invention. The surfactant is not particularly limited, and examples thereof include nonionic surfactant, anionic surfactant, cationic surfactant, amphoteric surfactant, and the like.

Furthermore, when the cleaning liquid of this embodiment contains alkanol hydroxyamine represented by the above-mentioned general formula (1) and alkanolamine represented by the general formula (2), it may not need to contain other anticorrosion agents, but it may contain other anticorrosion agents. Such other anticorrosion agents are not particularly limited, and examples thereof include nitrogen-containing heterocyclic compounds such as benzotriazole, aminotetrazole, 5-amino-1-phenyl tetrazole, 5-amino-1-(1-naphthyl)tetrazole, 1-methyl-5-aminotetrazole, 1,5-diaminotetrazole, imidazole, indole, purine, pyrazole, pyridine, pyrimidine, pyrrole, pyrrolidine, and pyrroline, and further a secondary amine compound, an amino acid compound, and the like.

«Anticorrosion Agent»

An anticorrosion agent of the present invention is a composition containing alkanol hydroxyamine represented by the above-mentioned general formula (1) and alkanolamine represented by the above-mentioned general formula (2), and the composition (typically, a liquid composition) is suitable as an anticorrosion agent.

Furthermore, in the anticorrosion agent of this embodiment, it is preferable that $R^{a1}$ in the above-mentioned general formula (1) and $R^{b1}$ in the above-mentioned general formula (2) are the same group, and $R^{a2}$ in the above-mentioned general formula (1) and $R^{b2}$ in the above-mentioned general formula (2) are the same group. Furthermore, in the anticorrosion agent of this embodiment, it is preferable that $R^{a1}$ and $R^{a2}$ in the above-mentioned general formula (1) are the same group, and $R^{b1}$ and $R^{b2}$ in the above-mentioned general formula (2) are the same group. It is more preferable that $R^{a1}$, $R^{a2}$, $R^{b1}$ and $R^{b2}$ are the same group.

As mentioned above, when a mixture of alkanol hydroxyamine and alkanolamine is used as the anticorrosion agent of this embodiment, corrosion of metal, in particular cobalt, copper, tungsten, silicide such as SiGe or other easily corrodible metal is effectively inhibited.

«Method for Manufacturing Cleaning Liquid or Anticorrosion Agent»

A method for manufacturing a cleaning liquid or an anticorrosion agent of the present invention is a method for manufacturing a cleaning liquid or an anticorrosion agent containing alkanol hydroxyamine represented by the above-mentioned general formula (1). The method includes synthesizing the alkanol hydroxyamine by oxidizing the alkanolamine represented by the above-mentioned general formula (2). The method for manufacturing the cleaning liquid or anticorrosion agent of the present invention is suitable as a method for manufacturing the cleaning liquid of the first embodiment of the present invention or the anticorrosion agent of second embodiment of the present invention.

Examples of an oxidizing agent for oxidizing alkanolamine include hydrogen peroxide and the like.

An addition amount of the oxidizing agent to alkanolamine is preferably 30 to 100 mol % and more preferably 60 to 80 mol % relative to the mole amount of alkanolamine. When such an addition amount is employed, it is possible to generate alkanol hydroxyamine from alkanolamine and to obtain a mixed solution having a high anti-corrosion effect.

A reaction temperature at which alkanolamine is oxidized is, for example, preferably 40 to 80° C. and more preferably 50 to 70° C. Furthermore, the reaction time is preferably 20 to 120 minutes and more preferably 30 to 90 minutes. When the oxidation reaction is carried out under such conditions, it is possible to generate alkanol hydroxyamine from alkanolamine and to obtain a mixed solution having a high anti-corrosion effect.

With this method, a mixture of alkanolamine as a starting material and alkanol hydroxyamine as a reaction product can be easily obtained, and the mixture obtained after oxidation reaction can be used as it is, namely, without isolating and purifying the alkanolamine or the alkanol hydroxyamine, for the cleaning liquid or the anticorrosion agent of this embodiment, thus improving manufacturing efficiency. Furthermore, it is possible to obtain a cleaning liquid or an anticorrosion agent having a higher anti-corrosion effect as compared with the case where alkanolamine or alkanol hydroxyamine is used alone as a cleaning liquid or an anticorrosion agent.

For example, as shown in the following reaction formula, diethanolamine as alkanolamine is oxidized by adding hydrogen peroxide solution ($H_2O_2$), whereby a reaction product (2,2'-(hydroxyimino)bis-ethanol as alkanol hydroxyamine) represented by the following structural formula can be obtained. However, in the following reaction, it is difficult to oxidize the whole amount of diethanolamine, thus the obtained reaction solution becomes a mixture of diethanolamine and 2,2'-(hydroxyimino)bis-ethanol. The yield of the 2,2'-(hydroxyimino)bis-ethanol as the alkanol hydroxyamine is about 25% to 70%, although the yield depends on the reaction conditions.

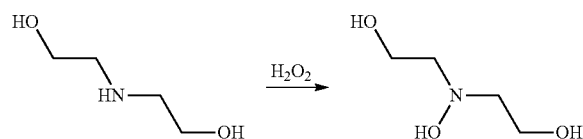 [SMILES: OCCNCCO ; "H2O2" ; OCCN(O)CCO]

«Cleaning Method»

A cleaning method using a cleaning liquid of the present invention is also one of the present invention. The cleaning method of the present invention is a method for cleaning a substrate using a cleaning liquid, using the above-mentioned cleaning liquids, anticorrosion agents, or cleaning liquids or anticorrosion agents manufactured by the above-mentioned method.

The cleaning of a substrate is suitable as cleaning of a substrate in lithography. For example, the cleaning method of this embodiment is a method for cleaning an etched substrate as a post step of an etching mask layer formation step of forming an etching mask layer having a predetermined pattern on a surface of the substrate, and an etching step of etching the substrate exposed from the above-mentioned etching mask layer. The cleaning method of this embodiment is suitable in a case where at least a part of a surface of the substrate is made of cobalt, copper, tungsten, silicide such as SiGe or other easily corrodible metal. At this time, at least a part of the cobalt, copper, tungsten, silicide such as SiGe or other easily corrodible metal is exposed on the surface of the substrate, and is brought into contact with the cleaning liquid. However, corrosion of the cobalt, copper, tungsten, silicide such as SiGe or other easily corrodible metal is satisfactorily inhibited. Therefore, cleaning using the above-mentioned cleaning liquid permits effective removal of a substance to be cleaned up while corrosion of cobalt, copper, tungsten, silicide such as SiGe or other easily corrodible metal is inhibited.

As mentioned below, in the cleaning method of this embodiment, according to the evaluation of the etching speed, the etching speed for cobalt is low as 0.2 nm/min or less, preferably 0.1 nm/min or less, and more preferably 0.09 nm/min or less, showing a large corrosion inhibition effect. Furthermore, similarly, according to the evaluation of the etching speed, the etching speed for copper can be made low as 0.4 nm/min or less, more preferably 0.2 nm/min or less, and more preferably 0.04 nm/min or less, and the corrosion inhibition effect can be expected. Furthermore, similarly, according to the evaluation of the etching speed, the etching speed for tungsten can be made low as 0.2 nm/min or less, preferably 0.1 nm/min or less, and more preferably 0.01 nm/min or less, and the corrosion inhibition effect can be expected. Further, similarly, according to evaluation of etching speed, the etching speed for SiGe can be made low as 0.05 nm/min or less, preferably 0.01 nm/min or less, and the corrosion inhibition effect can be expected. When the above-mentioned dialkanol hydroxyamine and dialkanolamine are used, the corrosion inhibition effect can be easily obtained for not only cobalt but also copper and tungsten, silicide such as SiGe or other easily corrodible metal.

A specific cleaning method is not particularly limited as long as it is usually carried out. For example, the cleaning method is carried out by bringing a substrate into contact with the above-mentioned cleaning liquid using a dipping method, a paddle method, a shower method, and the like, for 1 to 40 minutes. Cleaning is carried out usually at room temperature, but cleaning may be carried out at an increased temperature of about 85° C. in order to enhance the cleaning effect.

«Method for Inhibiting Corrosion»

As described above, a method for inhibiting corrosion of easily corrodible metal by using the above-described cleaning liquid or anticorrosion agent, or the cleaning liquid or anticorrosion agent manufactured according to the above-mentioned method is also one of the present invention. The method for inhibiting corrosion comprises bringing, for instance, cobalt, copper, tungsten, silicide such as SiGe, or other easily corrodible metal (for instance, a substrate having the easily corrodible metal exposed on the surface) into contact with the cleaning liquid or anticorrosion agent, and specifically, the method can be carried out in the same manner as the above-mentioned cleaning method.

Further, the method for inhibiting corrosion of easily corrodible metal by using the above-mentioned anticorrosion agent or the anticorrosion agent manufactured by the aforementioned method comprises adding the anticorrosion agent to a chemical liquid for lithography such as a cleaning liquid, a developer, a rinse, a stripping solution or the like so that the chemical liquid for lithograph contains the anticorrosion agent; and bringing, for instance, cobalt, copper, tungsten, and silicide such as SiGe or other easily corrodible metal (for instance, a substrate having the easily corrodible metal exposed on the surface) into contact with the chemical liquid for lithography. As the aforementioned method for inhibiting corrosion, a cleaning method which is commonly used in lithography (for instance, the aforementioned cleaning method), such as a developing method, a rinse method or a stripping method can be used, depending upon the type or application of the chemical liquid for lithography such as a cleaning liquid, a developer, a rinse or a stripping solution, to which the anticorrosion agent is added. As the chemical liquid for lithography to which the anticorrosion agent of the present embodiment is added, a cleaning liquid and a developer are preferred. As the developer, an alkali developer such as a 2.38% aqueous solution of tetramethyl ammonium hydroxide (TMAH) can be used.

A chemical liquid for lithography containing the anticorrosion agent of the present invention is also one of the present invention. As the chemical liquid for lithography, a cleaning liquid, a developer, a rinse, a stripping solution and the like can be exemplified and the cleaning liquid is preferred.

«Method for Manufacturing Semiconductor»

A method for manufacturing a semiconductor using a cleaning method of the present invention is also one of the present invention. The method for manufacturing a semiconductor of the present invention is a method for manufacturing a semiconductor including a substrate. The method includes cleaning a substrate using the above-mentioned cleaning method.

With the method according to this embodiment, as mentioned above, when at least a part of a surface of the substrate is formed of cobalt, copper, tungsten, silicide such as SiGe or other easily corrodible metal, a semiconductor can be manufactured with corrosion of cobalt, copper, tungsten, silicide such as SiGe or other easily corrodible metal inhibited.

«Method of Lithography»

A method of lithography comprising using the cleaning method of the present invention or the method for inhibiting corrosion of the present invention is also one of the present invention. The method for inhibiting corrosion of the present invention may be a method for inhibiting corrosion of easily corrodible metal by using the aforementioned cleaning liquid, the anticorrosion agent or the cleaning liquid or anticorrosion agent manufactured by the aforementioned method. Alternatively, the method for inhibiting corrosion of the present invention may be the aforementioned method for inhibiting corrosion comprising adding the anticorrosion agent to a chemical liquid for lithography such as a cleaning liquid, a developer, a rinse or a stripping solution and bringing easily corrodible metal (for instance, a substrate having the easily corrodible metal exposed on the surface) into contact with the chemical liquid for lithography.

EXAMPLES

Hereinafter, the present invention will be described in more detail with reference to Examples, but the present invention is not limited to the Examples.

Control Example

As a control example, a solution including 75.0 mass % of ethyl diglycol, 2.0 mass % of tetramethyl ammonium hydroxide (TMAH), and 23.0 of mass % of water (remainder) was prepared.

Examples 1 to 4

In Examples, a hydrogen peroxide solution ($H_2O_2$) was dropped to alkanolamines (monoethanolamine, diethanolamine, monoisopropanolamine, and diisopropanolamine) respectively dissolved in water, in the amounts shown in Table 1, while stirring at 60° C. for 60 minutes. Then, reaction was carried out at 60° C. for one hour further, and then the resultant reaction solutions were respectively added such that the obtained solutions were 0.5 parts by mass with respect to 99.5 parts by mass of solutions as control examples so as to prepare cleaning liquids, respectively.

For example, the composition of the cleaning liquid of Example 1 includes 75.0 parts by mass of ethyl diglycol, 2.0 parts by mass of tetramethyl ammonium hydroxide (TMAH), 0.5 parts by mass of the above-mentioned reaction solution, and 22.5 parts by mass of water (remainder).

As shown in Table 3, it was verified by liquid chromatography mass spectrometry (LC-MS) that each reaction solution obtained by adding a hydrogen peroxide solution to alkanolamine in Examples 1 to 4 was a mixture of alkanolamine as a starting material and alkanol hydroxylamine as a product of an oxidation reaction.

One example of the analysis results is shown. In the reaction solution obtained in Example 4, as a result of evaluation by the liquid chromatography mass spectrometry (LC-MS), a peak was observed in positions at which the m/z value was 134.1172 and 150.1122. From this result, it was shown that the reaction solution obtained in Example 4 was a mixture of diisopropanolamine as the starting material and diisopropanol hydroxyamine, in which one hydroxy group was bonded to a nitrogen atom, as a product of the oxidation reaction. Furthermore, when this reaction solution of Example 4 was evaluated by nuclear magnetic resonance apparatus (NMR), it was demonstrated that the molar ratio of starting material: reaction product was 59:41. The yield of diisopropanol hydroxyamine was 32.2%.

Example 5

A cleaning liquid was prepared by adding the reaction solution obtained in Example 4 to a 2.38% aqueous solution of tetramethyl ammonium hydroxide (TMAH) (NMD-3, manufactured by TOKYO OHKA KOGYO CO., LTD.), in the ratio of 1.0% by mass to 100% by mass.

Example 6

A cleaning liquid was prepared by adding the reaction solution obtained in Example 4 to an aqueous solution (NMD-W: manufactured by TOKYO OHKA KOGYO CO., LTD.) containing tetramethyl ammonium hydroxide (TMAH) by 2.38% and a surfactant, in the ratio of 1.0% by mass to 100% by mass.

Example 7

A cleaning liquid was prepared by adding 1.0% by mass of the reaction solution obtained in Example 4 to a mixed solution consisting of 65% by mass of dipropylene glycol monomethyl ether (DPM), 5% by mass of propylene glycol (PG), 2.0% by mass of tetramethyl ammonium hydroxide (TMAH) and 28% by mass (balance) of water.

Comparative Examples 1 to 6

In Comparative Examples 1 to 6, as shown in Table 2, 0.5 parts by mass each of mixtures, as comparison control compounds of the anticorrosion agent, which had been obtained by mixing monoethanolamine, diethanolamine, diethylamine, monoisopropanolamine, diisopropanolamine, and dipropylamine, with water, respectively, were added to 99.5 parts by mass of solutions as control examples so as to prepare cleaning liquids, respectively.

Comparative Example 7

In Comparative Example 7, as a comparison control compound of an anticorrosion agent, in an amount shown in Table 1, a hydrogen peroxide solution ($H_2O_2$) was dropped to dipropylamine dissolved in water while stirring at 60° C. for 60 minutes. Then, reaction was carried out at 60° C. for one hour further, then the resultant reaction solution was added such that the obtained solution was 0.5 parts by mass with respect to 99.5 parts by mass of a solution as a control example so as to prepare a cleaning liquid. The reaction solution obtained in Comparative Example 7 was a mixture of dipropylamine and dipropyl hydroxyamine as shown in Table 4.

Comparative Example 8

A cleaning liquid was prepared in the same manner as Example 5, except that the reaction solution obtained in Example 4 was not added.

Comparative Example 9

A cleaning liquid was prepared in the same manner as Example 6, except that the reaction solution obtained in Example 4 was not added.

Comparative Example 10

A cleaning liquid was prepared in the same manner as Example 7, except that the reaction solution obtained in Example 4 was not added.

TABLE 1

|  |  | Example 1 | Example 2 | Example 3 | Example 4 | Comparative Example 7 |
|---|---|---|---|---|---|---|
|  |  | | | Type of amine | | |
|  |  | Monoethanol-amine | Diethanol-amine | Monoisopropanol-amine | Diisopropanol-amine | Dipropyl-amine |
| Addition amount (g) | Amine | 6.1 | 10.5 | 7.5 | 13.3 | 10.2 |
|  | $H_2O_2$ | 2.4 | 2.4 | 2.4 | 2.4 | 2.4 |
|  | Water | 52.7 | 48.3 | 51.3 | 45.5 | 48.6 |

TABLE 2

|  |  | Comparative Example 1 | Comparative Example 2 | Comparative Example 3 | Comparative Example 4 | Comparative Example 5 | Comparative Example 6 |
|---|---|---|---|---|---|---|---|
|  |  | | | | Type of amine | | |
|  |  | Monoethanol-amine | Diethanol-amine | Diethyl-amine | Monoisopropanol-amine | Diisopropanol-amine | Dipropyl-amine |
| Addition amount(g) | Amine | 6.1 | 10.5 | 4.5 | 7.5 | 13.3 | 10.2 |
|  | Water | 55.1 | 50.7 | 56.7 | 53.7 | 47.9 | 51.0 |

[Evaluation of Etching Speed to Copper Layer, Tungsten Layer or Cobalt Layer]

Copper, tungsten, or cobalt were formed into a film on a silicon substrate to obtain a silicon substrate provided with a copper layer, a tungsten layer, or a cobalt layer having a thickness of 100 nm. The silicon substrate was soaked in a cleaning liquid warmed to 60° C. for 60 minutes. After soaking was completed, the silicon substrate was rinsed with pure water, and then, a film thickness of the copper layer, the tungsten layer, or the cobalt layer was measured. From the difference in film thickness before and after soaking, the etching speed of the copper layer, tungsten layer, or cobalt layer was calculated. Results are shown in Tables 3 and 4.

Evaluation of the etching speed in Tables 3 and 4 are based on the following criteria. Note here that the etching speeds of solutions of the control examples were 2.21 for the copper layer, 0.14 for the tungsten layer, and 0.35 for the cobalt layer. Unit of evaluation of the etching speed is "nm/min."

Copper (Cu)

Very good: 0.2 or less, Good: more than 0.2 and 0.4 or less, Poor: more than 0.4

Tungsten (W)

Very good: 0.1 or less, Good: more than 0.1 and 0.2 or less, Poor: more than 0.2

Cobalt (Co)

Very good: 0.1 or less, Good: more than 0.1 and 0.2 or less, Poor: more than 0.2

TABLE 3

| Additive | Example 1 Monoethanolamine + Monoethanol hydroxyamine | Example 2 Diethanolamine + Diethanol hydroxyamine | Example 3 Monoisopropanolamine + Monoisopropanol hydroxyamine | Example 4 Diisopropanolamine + Diisopropanol hydroxyamine |
|---|---|---|---|---|
| Cu (nm/min) | Good | Very good | Good | Very good |
| W (nm/min) | Good | Very good | Good | Very good |
| Co (nm/min) | Very good | Very good | Good | Very good |

TABLE 4

| Additive | Comparative Example 1 Monoethanol-amine | Comparative Example 2 Diethanol-amine | Comparative Example 3 Diethyl-amine | Comparative Example 4 Monoisopropanol-amine | Comparative Example 5 Diisopropanol-amine | Comparative Example 6 Dipropyl-amine | Comparative Example 7 Dipropylamine + Dipropyl hydroxylamine |
|---|---|---|---|---|---|---|---|
| Cu (nm/min) | Poor | Poor | Poor | Poor | Poor | Poor | Good |
| W (nm/min) | Poor | Good | Good | Poor | Good | Good | Good |
| Co (nm/min) | Poor | Poor | Poor | Poor | Poor | Poor | Poor |

From the results of Tables 3 and 4, cleaning liquids of each of Examples 1 to 4 including a mixed solution of alkanol hydroxyamine and alkanolamine showed lower etching speed and more excellent corrosion inhibition function with respect to cobalt as compared with the cleaning liquids of Comparative Examples 1 to 7 not including alkanol hydroxyamine. Among them, the cleaning liquids of Examples 2 and 4 which include a mixed solution of dialkanol hydroxyamine and dialkanolamine showed lower etching speed and more excellent corrosion inhibition function with respect to copper and tungsten as compared with cleaning liquids of Comparative Examples 1 to 7. It was verified that alkanol hydroxyamines obtained in Examples had higher Log P values and were more excellent in water-solubility as well as had lower vapor pressures and more excellent composition stability, than amines used in Comparative Examples.

[Evaluation of Etching Speed to SiGe Layer]

Silicon substrates each having a SiGe layer with a thickness of 100 nm were soaked in the cleaning liquids (25° C.) of Examples 5 to 7 and Comparative Examples 8 to 10 for 10 minutes. After soaking was completed, the silicon substrates were rinsed with pure water, and then, film thicknesses of the SiGe layers were measured. From the difference in film thickness before and after soaking, the etching speed of the SiGe layers was calculated. Results are shown in Table 5.

Evaluation of the etching speed in Table 5 is based on the following criteria. Unit of evaluation of the etching speed is "nm/min."

SiGe
Very good: 0.1 or less, o: more than 0.1 and 0.05 or less, x: more than 0.05

TABLE 5

|  | Example 5 | Example 6 | Example 7 | Comparative Example 8 | Comparative Example 9 | Comparative Example 10 |
| --- | --- | --- | --- | --- | --- | --- |
| SiGe (nm/min) | Good | Very good | Very good | Poor | Poor | Poor |

From the results of Table 5, it was confirmed that cleaning liquids of Examples 5 to 7 containing the reaction solution which was obtained in Example 4 and which contained a mixed solution of alkanol hydroxyamine and alkanolamine showed lower etching speed and more excellent corrosion inhibition function with respect to SiGe layer as compared to the cleaning liquids of Comparative Examples 8 to 10 which did not contain alkanol hydroxyamine(1,1'(hydroxyimino)bis-(2-propanol)).

What is claimed is:

1. A cleaning liquid comprising alkanol hydroxyamine represented by the following general formula (1), alkanolamine represented by the following general formula (2), a solvent, as well as a basic compound other than the alkanol hydroxyamine and the alkanolamine, or an acidic compound:

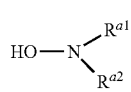
(1)

wherein $R^{a1}$ and $R^{a2}$ each independently represent a C1-C10 alkyl group having one to three hydroxy groups, or a hydrogen atom,
where $R^{a1}$ and $R^{a2}$ are not simultaneously a hydrogen atom;

(2)

wherein $R^{b1}$ and $R^{b2}$ each independently represent a C1-C10 alkyl group having one to three hydroxy groups, or a hydrogen atom,
where $R^{b1}$ and $R^{b2}$ are not simultaneously a hydrogen atom.

2. The cleaning liquid according to claim 1, wherein $R^{a1}$ in the general formula (1) and $R^{b1}$ in the general formula (2) are the same group, and $R^{a2}$ in the general formula (1) and $R^{b2}$ in the general formula (2) are the same group.

3. The cleaning liquid according to claim 1, wherein $R^{a1}$ and $R^{a2}$ in the general formula (1) are the same group, and $R^{b1}$ and $R^{b2}$ in the general formula (2) are the same group.

4. An anticorrosion agent comprising alkanol hydroxyamine represented by the following general formula (1) and alkanolamine represented by the following general formula (2):

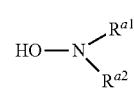
(1)

wherein $R^{a1}$ and $R^{a2}$ each independently represent a C1-C10 alkyl group having one to three hydroxy groups, or a hydrogen atom,
where $R^{a1}$ and $R^{a2}$ are not simultaneously a hydrogen atom;

(2)

wherein $R^{b1}$ and $R^{b2}$ each independently represent a C1-C10 alkyl group having one to three hydroxy groups, or a hydrogen atom,
where $R^{b1}$ and $R^{b2}$ are not simultaneously a hydrogen atom.

5. A method for manufacturing a cleaning liquid or an anticorrosion agent comprising alkanol hydroxyamine represented by the following general formula (1), the method comprising:
synthesizing the alkanol hydroxyamine by oxidizing alkanolamine represented by the following general formula (2):

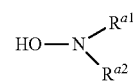
(1)

wherein $R^{a1}$ and $R^{a2}$ each independently represent a C1-C10 alkyl group having one to three hydroxy groups, or a hydrogen atom,
where $R^{a1}$ and $R^{a2}$ are not simultaneously a hydrogen atom;

(2)

wherein $R^{b1}$ and $R^{b2}$ each independently represent a C1-C10 alkyl group having one to three hydroxy groups, or a hydrogen atom,
wherein $R^{b1}$ and $R^{b2}$ are not simultaneously a hydrogen atom.

6. A method for cleaning a substrate comprising using the cleaning liquid according to claim 1.

7. A method for cleaning a substrate comprising using the anticorrosion agent according to claim 4.

8. A method for cleaning a substrate comprising using the anticorrosion agent manufactured by the method according to claim 5.

9. The method according to claim 6, wherein the cleaning of a substrate is cleaning of a substrate in lithography.

10. A method for manufacturing a semiconductor comprising a substrate, the method comprising cleaning the substrate using the method according to claim 6.

11. A method for inhibiting corrosion of easily corrodible metal, comprising bringing the easily corrodible metal into contact with the cleaning liquid according to claim 1.

12. A method for inhibiting corrosion of easily corrodible metal, comprising bringing the easily corrodible metal into contact with the anticorrosion agent according to claim 4.

13. A method for inhibiting corrosion of easily corrodible metal, comprising bringing the easily corrodible metal into contact with the cleaning liquid or anticorrosion agent manufactured by the method according to claim 5.

\* \* \* \* \*